United States Patent [19]

Kawana et al.

[11] 4,312,109

[45] Jan. 26, 1982

[54] APPARATUS FOR INSERTING ELECTRONIC ELEMENTS

[75] Inventors: Takeshi Kawana; Toshiaki Murai, both of Yokohama; Naoyuki Sakurai, Hadano, all of Japan

[73] Assignee: Hitachi, Ltd., Tokyo, Japan

[21] Appl. No.: 138,655

[22] Filed: Apr. 9, 1980

[30] Foreign Application Priority Data

Feb. 25, 1980 [JP] Japan .............................. 55-21684

[51] Int. Cl.³ .............................................. H05K 3/30
[52] U.S. Cl. .................................. 29/564.6; 29/564.8; 29/566.1; 29/566.3; 29/739
[58] Field of Search ................. 29/564.6, 564.8, 564.7, 29/566.2, 566.3, 566.1, 739, 741, 564.2, 564.1, 33 M

[56] References Cited

U.S. PATENT DOCUMENTS

| | | | |
|---|---|---|---|
| 3,777,350 | 12/1973 | Maeda et al. | 29/564.6 X |
| 4,051,593 | 10/1977 | Mori et al. | 29/564.6 |
| 4,054,988 | 10/1977 | Masuzima et al. | 29/564.6 |
| 4,196,513 | 4/1980 | Harigane et al. | 29/741 |
| 4,205,433 | 6/1980 | Araki et al. | 29/564.8 X |
| 4,245,385 | 1/1981 | Zemek et al. | 29/564.8 |
| 4,263,708 | 4/1981 | Takahashi et al. | 29/564.6 |

FOREIGN PATENT DOCUMENTS

| | | | |
|---|---|---|---|
| 2033795 | 5/1980 | United Kingdom | 29/739 |
| 2045117 | 10/1980 | United Kingdom | 29/739 |

*Primary Examiner*—William R. Briggs

*Attorney, Agent, or Firm*—Craig and Antonelli

[57] ABSTRACT

An apparatus for inserting electronic elements comprises means for supplying electronic elements, means for cutting to different lengths a plurality of lead wires extended in the same direction from the body of an electronic element supplied by the electronic element supply means, a chuck mechanism for holding the body of the electronic element with the lead wires thereof cut to different lengths by the cutting means, means for changing the direction of the lead wires with respect to insertion holes by swivelling the chuck mechanism by a predetermined angle around an axis perpendicular to the plane of a printed circuit board, an insertion head including insertion means for inserting the lead wires into the insertion holes by moving the chuck mechanism vertically with respect to the printed circuit board, an index table for moving the insertion head stepwise from at least a lead wire forward end position measuring station to a lead wire insertion station, means for measuring the forward end position of each lead wire of the electronic element held by the chuck mechanism of the insertion head at the lead wire forward end position measuring station, and means for correcting the positions of the insertion holes of the printed circuit board by moving it along X and Y axes in accordance with the forward end positions of the lead wires measured by the measuring means at the lead wire insertion station. The lead wires are inserted into the insertion holes associated therewith in descendent order of the length of the lead wires sequentially.

10 Claims, 25 Drawing Figures

APPARATUS FOR INSERTING ELECTRONIC ELEMENTS

BACKGROUND OF THE INVENTION

1. Field of the Invention

The present invention relates to an apparatus for inserting lead wires of electronic elements into insertion holes of a printed circuit board, or more in particular to an apparatus for inserting into insertion holes of a printed circuit board or the like the lead wires of electronic elements of radial lead wire type, which lead wires are protruded in parallel in a specific direction from a body.

2. Description of the Prior Art

Prior art apparatuses of this type for inserting electronic elements are such that in order to set the insertion holes of a printed circuit board to the lead wires of the electronic elements to be inserted, the lead wires are guided by a pair of opposed lead guides as disclosed in U.S. Pat. No. 3,777,350 or the lead wires are chucked at regular intervals of space by the lead wire guides and a lead wire holder, so that the forward ends of the lead wires are set at the positions of the insertion holes of the printed circuit board for successful insertion. In such conventional apparatuses for inserting electronic elements, however, in view of the fact that the lead wires under a body of an electronic element are guided by the lead guides or chucked by means of the lead guides and a lead holder, the lead guides or the chuck comprising the lead guides and the lead holder follows the lead wires of the electronic elements being inserted into insertion holes of the printed circuit board and, after insertion, it is necessary to relieve and retire the lead guides or chuck beyond the horizontal outer margin of the body of the electronic elements, thus unavoidably requiring a space larger than the horizontal maximum size of the body of the electronic elements. The recent trend is toward a more compact printed circuit board with electronic elements mounted therein at higher density. In the conventional apparatuses for inserting electronic elements, it is impossible to automatically insert the electronic elements into a printed circuit board at high density. Another disadvantage of the prior art apparatuses for inserting electronic elements lies in that the lead guides or chuck is so complicated that their use is limited to electronic elements having a fixed pitch between lead wires, resulting in a very low productivity. Further, the conventional apparatuses for inserting electronic elements are very low in insertion speed.

SUMMARY OF THE INVENTION

Accordingly, it is an object of the present invention to provide an apparatus for inserting electronic elements into insertion holes of a printed circuit board accurately at high efficiency, in which the electronic elements can be mounted at high density on a printed circuit board on the one hand and the same insertion head can insert lead wires of the electronic element having a variety of pitches of lead wires on the other hand.

In order to attain the above-mentioned object, according to the present invention, there is provided an electronic element insertion apparatus comprising means for supplying electronic elements, means for cutting to different lengths a plurality of lead wires extended in the same direction from a body of an electronic element supplied from the electronic elements supply means, a chuck mechanism for holding the body of the electronic element whose lead wires are cut to different lengths by the cutting means, means for changing the direction of the plurality of lead wires with respect to insertion holes of a printed circuit board by swivelling the chuck mechanism by a predetermined angle around an axis perpendicular to the plane of the printed circuit board, means for moving an insertion head stepwise from at least a measured position of the forward end of the lead wire to a lead wire insertion position, the insertion head including means for inserting the lead wires into the insertion holes of the printed circuit board while moving the chuck mechanism vertically with respect to the printed circuit board, means disposed at the lead wire forward end measuring position for measuring the position on the surface of the printed circuit board, of the forward end of each lead wire of the electronic element held by the chuck mechanism of the insertion head, and positioning means provided at the lead wire insertion position and including an X table and a Y table for positioning each insertion hole of the printed circuit board by correctively moving the same along the X and Y axes in accordance with the position of the forward end of each lead wire measured by the measuring means, in which on the basis of the position of the forward end of a longer lead wire measured by the measuring means, the position of the axis of the forward end of the longer lead wire and the center position of the insertion hole of the printed circuit board are set to each other by relatively moving them, the insertion means of the insertion head moving the electronic element toward the printed circuit board thereby to insert the forward end of the longer lead wire into an insertion hole of the printed circuit board, the position of the central axis of the forward end of a shorter lead wire and the central position of the insertion hole of the printed circuit board being set to each other by relative movement thereof on the basis of the position of the forward end of the shorter lead wire measured by the measuring means, the insertion means of the insertion head moving the electronic element toward to the printed circuit board thereby to insert the forward end of the shorter lead wire into an insertion hole of the printed circuit board, thus sequentially inserting a plurality of lead wires of the electronic element into the insertion holes of the printed circuit board. The above described measuring means includes an image pick-up device such as a TV camera capable of measuring the position of the forward end of the lead wire contactlessly optically thereby to prevent the lead wire from being deformed in measurement. The above described moving means includes an index table available for stepwise rotation and carrying along the outer periphery thereof a plurality of insertion heads, various devices including the cutting means and delivery means being arranged around the index table thereby enabling the lead wires of the electronic elements to be inserted into the insertion holes of the printed circuit board continuously at high speed, the chuck mechanism of the insertion head receiving and holding the body of the electronic elements separately supplied from the electronic elements supply means with the lead wires thereof having a tape chip.

The above described cutting means cuts the lead wires thus held to different lengths and cutting off the tape chip, thereby preventing the lead wires from being deformed at the time of delivery of the electronic elements.

DETAILED DESCRIPTION OF THE PREFERRED EMBODIMENTS

Figure 1A:
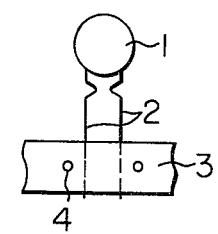
FIGS. 1a to 1c are outside views of electronic elements taped to each other for insertion by an inserting apparatus according to the present invention.
Figure 1B:
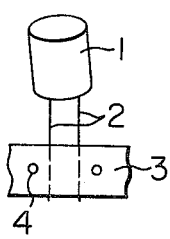
Figure 1C:
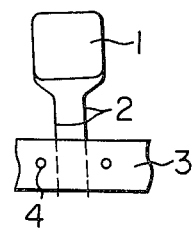

Electronic elements in taped form are shown in FIGS. 1a to 1c. As shown in these drawings, lead wires 2 of an electronic element 1 are extended in the same direction from a body of the electronic element and so formed as to maintain a predetermined space therebetween. The ends of the lead wires 2 of the electronic element 1 are attached to a tape 3 at a predetermined interval of space. Holes 4 functioning to feed and position the tape 3 at the same time are formed at predetermined intervals of space in the tape 3.

Figure 2:
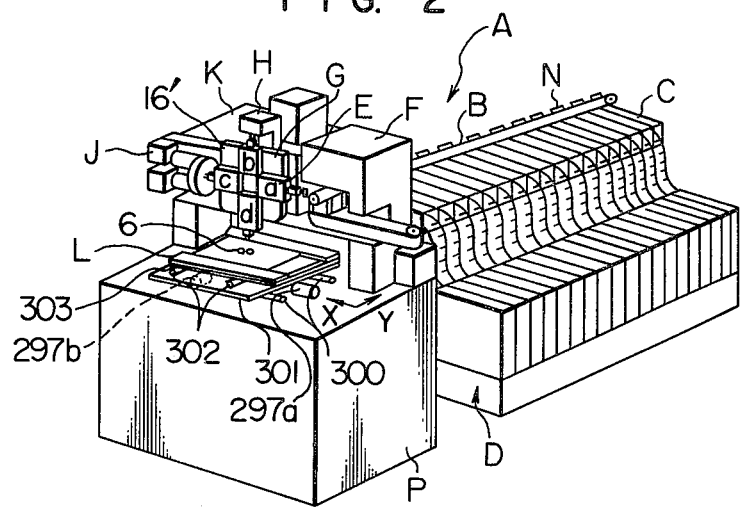
FIG. 2 is a perspective view of the appearance of an apparatus for inserting electronic elements according to the present invention.
Figure 3A:
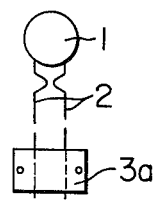
FIGS. 3a to 3c are diagrams showing leads of electronic elements cut to different lengths by a cutting device of FIG. 2.
Figure 3B:
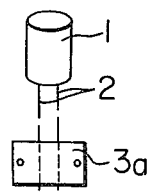
Figure 3C:
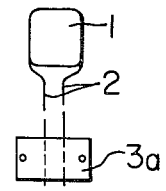

A general configuration of an electronic element insertion apparatus according to an embodiment of the present invention is shown in the perspective view of FIG. 2. As will be seen from this drawing, an electronic element insertion apparatus A comprises parts supply means D including a plurality of elements supply units C aligned to each other for supplying the electronic element 1 with tape 3 one by one to transport pallets N of an element carriage B appropriately, the element supply means D containing the electronic element 1 connected with tape 3, delivery means F for receiving the electronic element 1 from the transport pallets N of the element supply means D and delivering them to insertion heads E, an index section G including a plurality of insertion heads E and adapted to rotate for indexing, a cutting device H for cutting the lead wires 2 of the electronic element 1 to different lengths as shown in FIGS. 3a to 3c, the body of the electronic element 1 being held by the insertion heads E, a measuring instrument J for measuring the position of the forward end of the lead wires 2 on the surface of the printed wiring substrate 5, a driving section K for opening or closing the chuck of the insertion head for holding the body of the electronic element 1 or rotating the insertion heads E, a positioning device L for fixing the printed wiring substrate 3 and positioning the predetermined holes 6 of the printed circuit board 5 with respect to the position of insertion of the lead wires 2 of the electronic element 1, and a bending device (not shown) for cutting and bending to predetermined length the lead wires 2 inserted into the insertion holes 6 and fixing the electronic element 1 to the printed circuit board 5.

Figure 4:
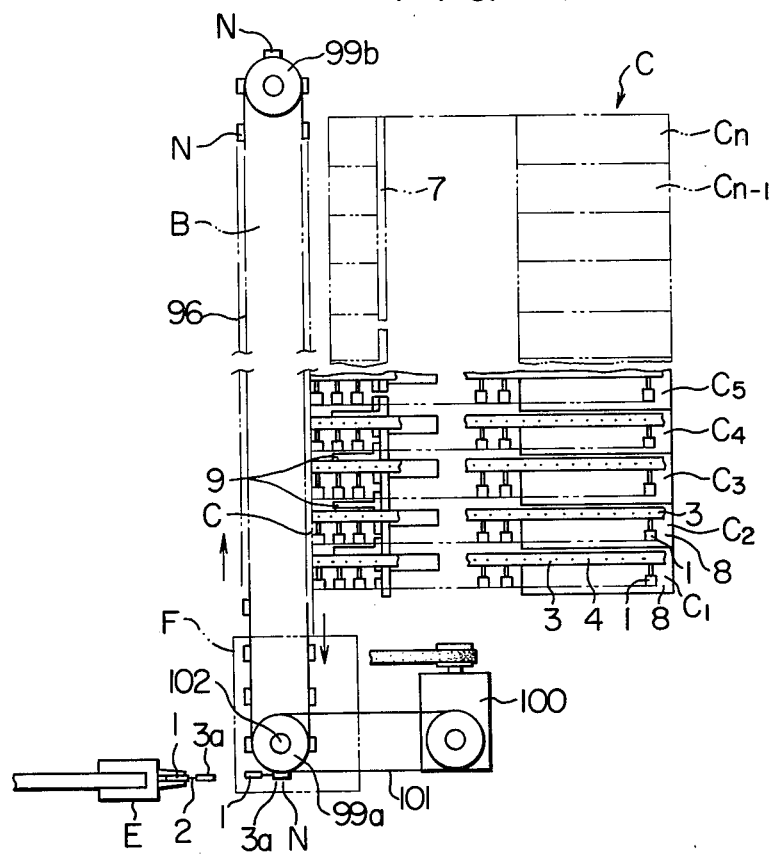
FIG. 4 is a diagram showing the construction of an electronic element supply means.

A plan view of the supply unit C is shown in FIG. 4. As shown in these FIG. 4 and FIG. 2, the supply unit C comprises a tape feed mechanism for pulling out the taped electronic element 1 from a case 8, a tape cutting mechanism for separating the taped electronic element 1 with tape chip into individual parts, and a delivery mechanism for positioning the transport pallets N for delivery thereto. A tape feed mechanism and tape cutting mechanism for each type of electronic elements are provided on a mounting bracket 9. A plurality of mounting brackets 9 corresponding to various types of electronic element 1 are mounted in juxtaposition on a mounting table 7. The mechanism for delivery to the pallets is provided on the mounting table 7. In order to supply several types of electronic elements, the mounting table 7 of a sufficient width to permit mounting of several types of supply units C is secured to the body frame P of the insertion apparatus. Tape chips 3a thus separated are delivered to the transport pallets N.

The transport pallets N are adapted to stop at positions under the element supply units $C_1$ to $C_n$ respectively.

As mentioned above, the transport pallets N that have received the electronic element 1 are transported by the element carriage B to the delivery device F. The delivery device F of the insertion heads holds the lead wires of the electronic element 1, positions them along the direction of extension of the lead wires with reference to the body bottom, and thus transfer the electronic element 1 with tape chip 3a from the transport pallet N to the insertion heads E, which hold the body of each electronic element 1.

As shown in FIG. 2, the insertion head E indexes a station (a) for receiving the electronic element 1 from the delivery device F, a station (b) for cutting the lead wires 2 of the electronic part 1 to different lengths by the cutting device H, a station (c) for measuring the position of the forward ends of the lead wires 2 on the surface of the printed circuit board 5 by the measuring instrument J, and a station (d) for inserting the lead wires 2 of the electronic element 1 into predetermined insertion holes 6 of the printed circuit board 5, the indexing being performed by means of the index unit 160 of the indexing section G.

Figure 5:
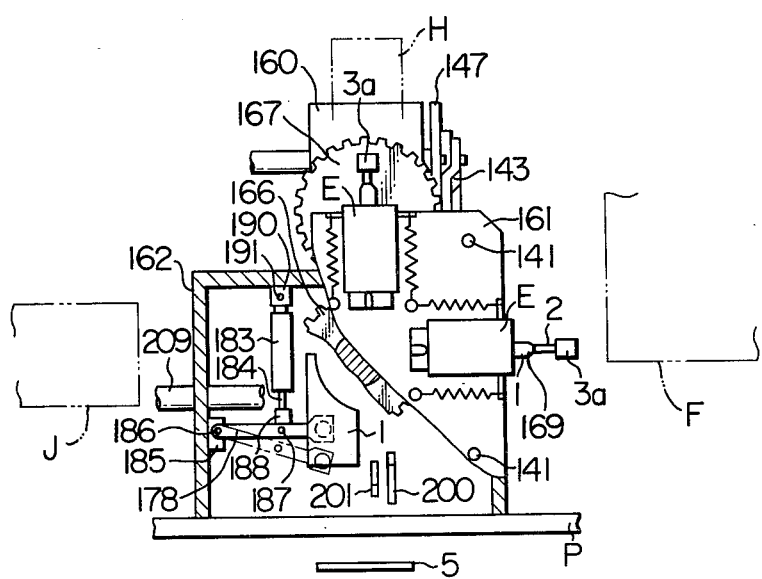
FIG. 5 is a partially cut-away front view of an index section and a driving section.
Figure 6A:
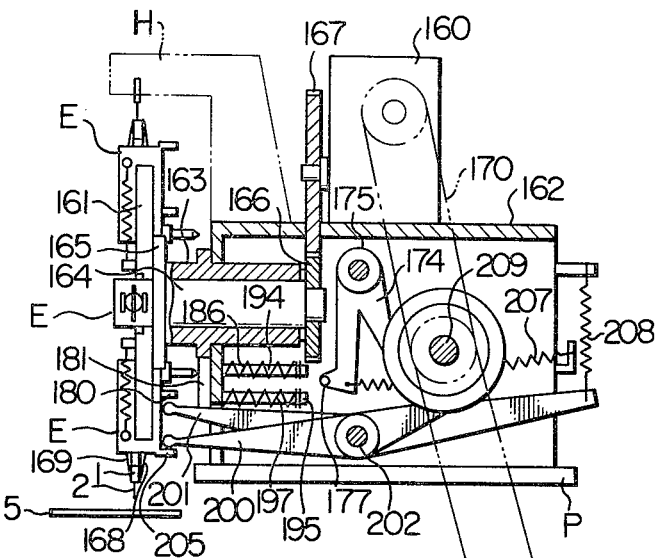
FIG. 6a is a cut-away side view of an index section and a driving section.
Figure 6B:
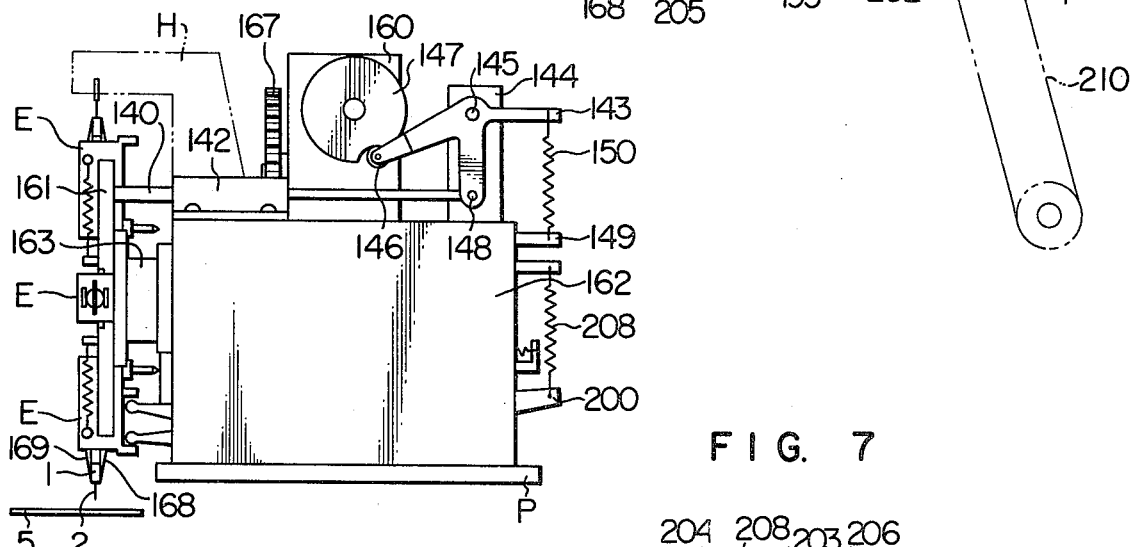
FIG. 6b is a side view thereof.
Figure 7:
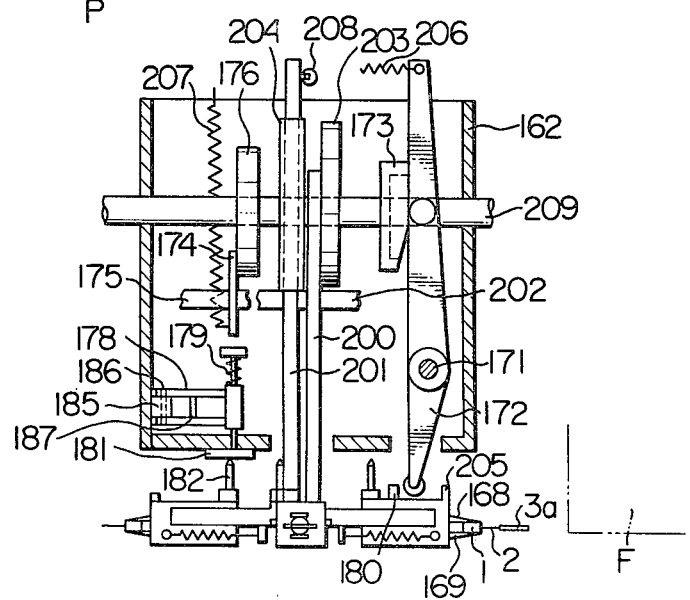
FIG. 7 is a partially cut-away plan view of the driving section.
Figure 8:
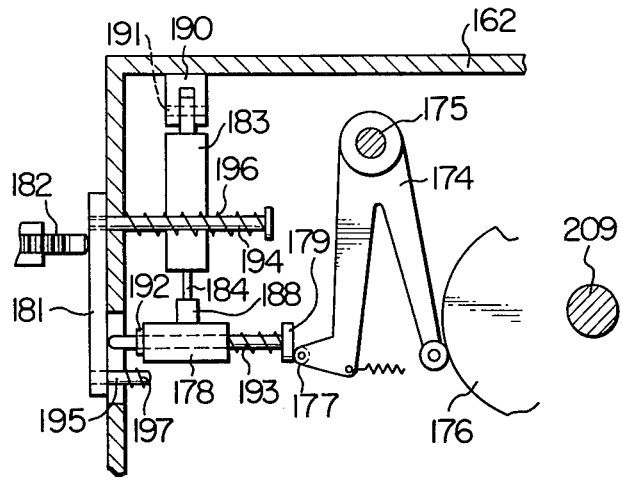
FIG. 8 is a side view showing the constructions of FIGS. 6a and 6b in partially enlarged form.

The insertion head E, the indexing section G and the driving section K will be described in detail below with reference to FIGS. 5 to 13. Four insertion heads E are slidably mounted on the table 161 connected with an index unit 160. As shown in FIGS. 5 and 6, the table 161 is secured to a flange 165 of a table shaft 164 rotatably supported by a bearing 163 mounted on a frame 162 fixed on the machine base P. The other end of the table shaft 164 fixedly carries a gear 166 in mesh with a gear 167 fixed on the index unit 160. The index unit 160 is adapted to be driven by a belt 170. Positioning holes 141 holding positioning rods 140 for positioning the table in rotational direction are formed at four corners of the table 161. The positioning rods 140 are slidably supported on the bearing 142 provided on the upper surface of the frame 162. A cam follower arm 143 is rotatably supported by a shaft 145 to a bracket 144 on the upper side of the frame 162. A cam follower roller 146 mounted at an end of the cam follower arm 143 is engaged with a cam 147 mounted on the output shaft of the index unit 160. The other end of the cam follower arm 143 is rotatably connected by a pin 148 to the rear end of the positioning rod 140. A spring 150 is suspended between the other end of the cam follower arm 143 and the pin 149 secured to the frame 162, so that the cam follower roller 146 engages the cam 147. Thus by driving the index unit 160, the insertion heads E move the stations (a) to (d) intermittently, and at the same time, the positioning rods 140 are inserted into the positioning holes 141 of the table 161, thus positioning the electronic element in an accurate indexing direction. The driving section K drives the index unit 160, closes or opens the chucks 168 and 169 for holding or releasing the electronic element 1 by the insertion heads E, drives up and down the insertion heads E at station (d), and rotates the insertion heads E that have chucked the electronic element 1 at station (d), in the direction X or Y with respect to the plane of the printed circuit board 5. The electronic element 1 with tape chip 3a supplied by the delivery device F to the insertion heads is received by opening the chucks 168 and 169 at station (a). After receipt of the electronic element 1, the chucks 168 and 169 are closed in such a manner that as shown in FIGS. 7 and 8, the end cam 173 is driven by the lever 172 supported rotatably on the supporting point 171 thereby to drive the chuck operating pin 180 of the insertion head E. In order to rotate the chucks 168 and 169 during transfer of the heads E from station (c) to (d) and at station (d), a lever 174 is rotatably supported on the supporting point 175. This lever 174 is in contact with a cam 176. The lever 174 has a roller 177 at an end thereof adapted to be in contact with a projecting pin 179 supported slidably on an X-Y rotation selection lever 178 of the insertion head E. The other end of the projecting pin 179 is pressed against a Y rotary plate 181, which is in contact with a rack 182 of the insertion head E. Therefore, the rotation of the cam 176 drives the lever 174, so that the projecting pin 179 moves and the rack 182 is driven by the Y rotary plate 181. This is for rotating the chucks 168 and 169 of the insertion head E in accordance with a predetermined insertion program. In the case where the insertion head is not rotated, by contrast, the cylinder 183 is driven and the rod 184 is urged downward, so that the projecting pin 179 is kept off from the roller 177 of the lever 174. As shown in FIGS. 5 and 8, the selection lever 178 is rotatably supported by a pin 186 at a hinge block 185 secured to the frame 162. A pin 187 is fixed halfway on the selection lever 178 which is swingably coupled with a joint 188 mounted at the forward end of the rod 184 of the cylinder 183. The cylinder 183 is rotatably mounted by a pin 191 on the hinge block 190 secured to the frame 162. The projecting pin 179 has a retaining ring 192 for restricting the expansion 193 of the compression spring 193. As shown in FIGS. 6 and 8, the Y rotary plate 181 fixedly carries two guide bars 194 and 195 slidably fitted in the frame 162 and thus kept in contact with the frame 162 by the compression springs 196 and 197. The Y rotary plate 181 is adapted to move away from the frame 162 by the projecting pin 179.

Figure 9:
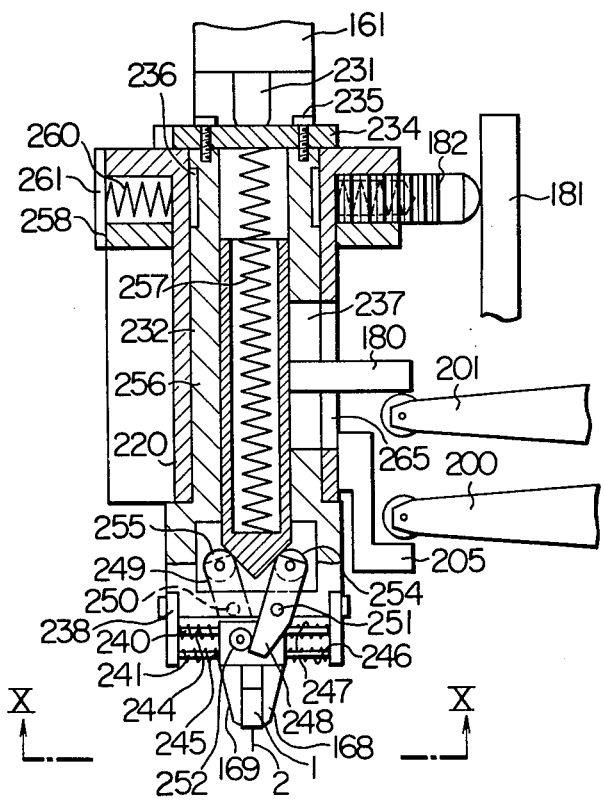
FIG. 9 is a partially cut-away side view of an insertion head.
Figure 10:
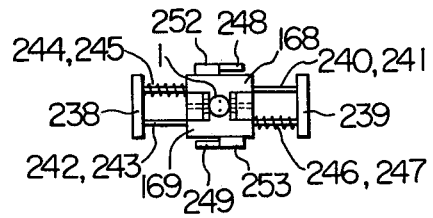
FIG. 10 is a sectional view taken in line X—X in FIG. 9.
Figure 11:
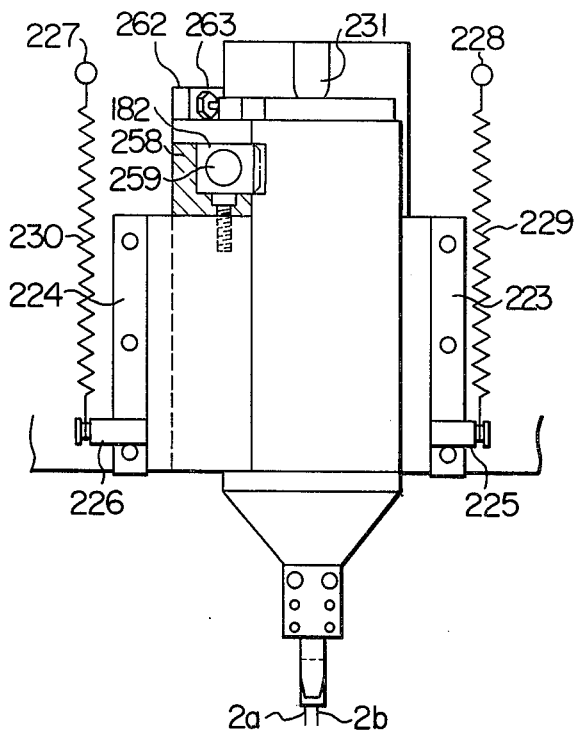
FIG. 11 is a partially cut-away front view of an insertion head.
Figure 12:
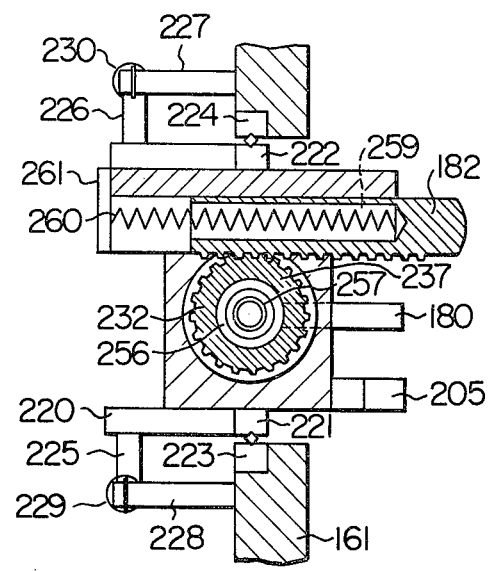
FIG. 12 is a sectional plan view of an insertion head.

It will be seen from FIGS. 6, 7 and 9 that the station (d) has a lever 200 for insertion in two steps and a lever 201 for opening the chucks 168 and 169. The levers 200 and 201 are swingably supported at the supporting point 202 and driven by the cams 203 and 204 respectively. The cam 203 is a grooved cam. The lever 200 is arranged to drive an L piece 205 for vertical motion of the insertion head E. Also the lever 201 is adapted to drive the pin 180 for opening and closing the chuck of the insertion head E. The levers 172, 174 and 201 carry tension springs 206, 207 and 208 respectively to follow the operation of the cams. The other end of each of the tension springs 206, 207 and 208 is fixed on the frame 162. The supporting points 171, 175 and 202 are supported on the frame 162. The cams 173, 176, 203 and 204 are secured to the cam shaft 209. The cam shaft 209 is directly coupled with a driving system including a motor or the like for driving the belt 210. The belt 210 rotates in synchronism with the belt 170.

Figure 13:
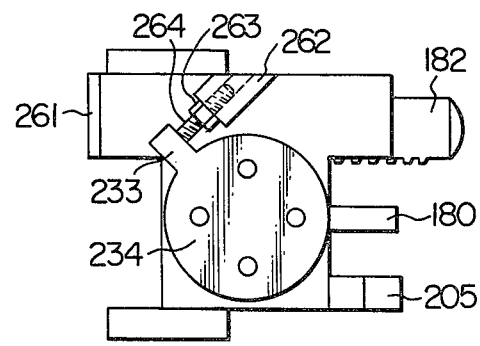
FIG. 13 is a plan view of an insertion head.

The insertion head E as shown in FIGS. 9 to 13 fixedly carries roller guides 221 and 222 on the body 220 thereof, and the roller guides 223 and 224 are fixed on the table 161, thus rendering the body slidable. Spring-loaded pins 225 and 226 are fixed on the body 220, while spring-loaded pins 227 and 228 are fixed on the table 161. Tension springs 229 and 230 are suspended between the pin 227 and the pin 226 and between the pin 225 and the pin 228 respectively for urging the insertion head E toward the center of the table 161 until it is stopped by a stopper 231 secured to the table 161. A circular hole is formed through the central part of the body 220. The chuck shaft 232 rotatable around the circular hole, together with the cover 234 having a stopper 233, is combined with the body 220 by screws 235. At the upper part of the chuck shaft 232, a pinion 236 is formed to engage the rack 182. At the middle part of the chuck shaft 232, on the other hand, there are formed a relief hole for the chuck operating pin 180 and a relief recess 237 used at the time of rotation of the chuck shaft 232. The chucks 168 and 169 are provided under the chuck shaft 232. The chucks 168 and 169 are slidably incorporated into the shafts 240, 241, 242 and 243 fixed on the bearings 238 and 239 mounted on the chuck shaft 232. The chucks 168 and 169 are adapted to be urged in opposite directions by the compression springs 244, 245, 246 and 247. The operating levers 248 and 249 are swingably mounted on the supporting shafts 250 and 251 fixed on the chuck shaft 232. An end of each of the operating levers 248 and 249 is in contact with the rollers 252 and 253 mounted on the chucks 168 and 169, and the other end thereof has rollers 254 and 255 in contact with chuck-operating shaft 256 with a conical end. A compression spring 257 is incorporated into a blind hollow portion of the chuck operating shaft 256. Thus the chuck operating shaft 256 is pressed downward so that the operating levers 248 and 249 are swung thereby to urge the chucks 168 and 169 in closing direction. A chuck operating pin 180 is press-fitted on the halfway of the chuck operating shaft 256. The rack 182 in mesh with the upper pinion 236 of the chuck shaft 232 is guided slidably by a guide 258 mounted on the body 220. The rack 182 has a blind hollow portion 259 into which a compression spring 260 is incorporated, so that the chuck shaft 232 is normally urged in clockwise direction along the axis of the shaft. The compression spring 260 is pressed by the cover 261. The clockwise swing of the chuck shaft 232 is restricted by the fact that as shown in FIG. 13 the stopper 233 of the cover 234 mounted on the chuck shaft 232 comes into contact with the stopper 264 fixed by the screw nut 263 to the protrusion 262 on the side of the body 220. Thus the rack 182 is prevented from being released. The body 220 fixedly carries an L metal 205. The body 220 also has a hole 265 for passing the chuck operating pin 180. In this configuration, when the chuck operating pin 180 is urged upward by the lever 201, the chucks 168 and 169 are opened. When the L metal 254 is urged downward by the lever 200, the whole insertion head E is moved downward. Also, the Y rotary plate 181 causes the chucks 168 and 169 mounted on the chuck shaft 232 to rotate in counterclockwise direction. Thus at the station (a), in order to receive the electronic element 1 supplied from the delivery device F for the insertion head E, the lever 172 is driven as shown in FIG. 7, the chuck operating pin 180 is driven, the chuck operating shaft 256 is retired, and thus the chucks 168 and 169 are opened for receiving the body of the electronic element 1. Then the lever 172 is driven in reverse direction and the chuck operating shaft 256 is thus moved forward, with the result that the chucks 168 and 169 are closed thereby to chuck the body of the electronic element 1. Under this condition, the stations (b) and (c) are moved, and at station (d), the lever 200 is driven thereby to move the body 220 downward in two steps. Thus the body 220 is moved toward the printed circuit board 5 in two steps, the longer one of the lead wires 2 is inserted into one insertion hole 6 of the printed circuit board, and the shorter one is inserted into another insertion hole 6 of the printed circuit board. After insertion, the electronic element 1 is fixed on the printed circuit board by a bending device (not shown), the lever 201 is driven so that the chuck operating shaft 256 is moved up, and the chucks 168 and 169 are opened thereby to release the electronic element 1. While this condition is maintained, the lever 200 is moved up in synchronism with the lever 201, so that the body 220 comes away from the printed circuit board, thus completing the insertion process.

Figure 14A:
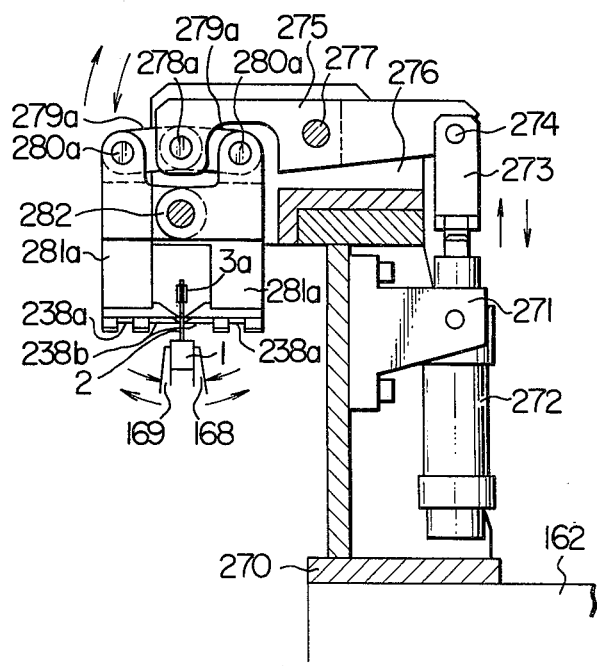
FIG. 14a is a side view of the cutting means.
Figure 14B:
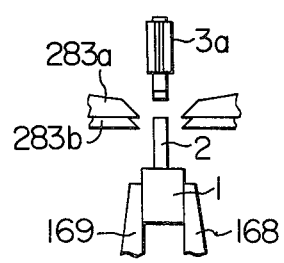
FIG. 14b is a diagram showing a lead wire with the forward end thereof cut in flat form.
Figure 15:
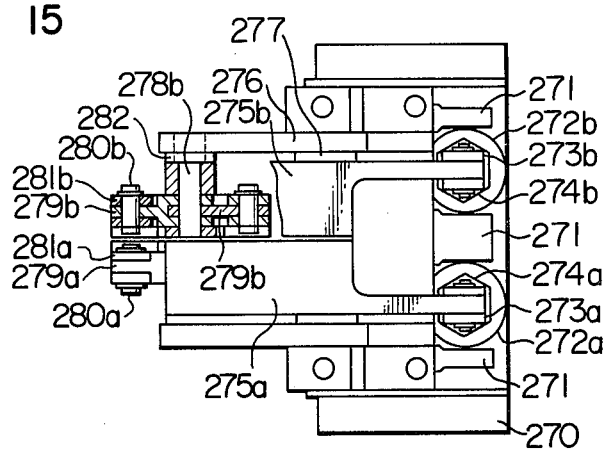
FIG. 15 is a plan view thereof.

The cutting device H is located at station (b). As shown in FIGS. 14 and 15, when cylinders 272a and 272b mounted through a supporting block on the lower frame 270 of the frame 162 move in the direction of arrow (a), the levers 275a and 275b swing in the direction of arrow (b) around a supporting pin 277 mounted on the upper frame 276 through the joint pins 274a and 274b and the joints 273a and 273b at the ends of the cylinders 272a and 272b. A pair of links 279a and 279b coupled by the lever pins 278a and 278b mounted at the forward ends of the levers 275a and 275b and a pair of cutter holders 281a and 281b coupled by the link pins 280a and 280b are swung in the direction (c) around the holder supporting pin 282 mounted on the upper frame 276. The cutters 283a and 283b mounted on the cutter holders 281a and 281b are closed toward each other so that the lead wires 2 of the electronic element 1 with the tape chip 3a are cut to different predetermined lengths with the forward ends thereof in falt form as shown in FIG. 14b. When the cylinders 272a and 272b return in the direction (d), on the other hand, the levers 275a and 275b swing in the direction (e), so that the cutter holders 281a and 281b are opened in the direction (f) through a couple of links 279a and 279b. As mentioned above, there are provided two units (shown by surfixes a and b) with a cutter in order to cut the lead wires 2 to different lengths (as shown in FIGS. 3a to 3c).

Figure 16:
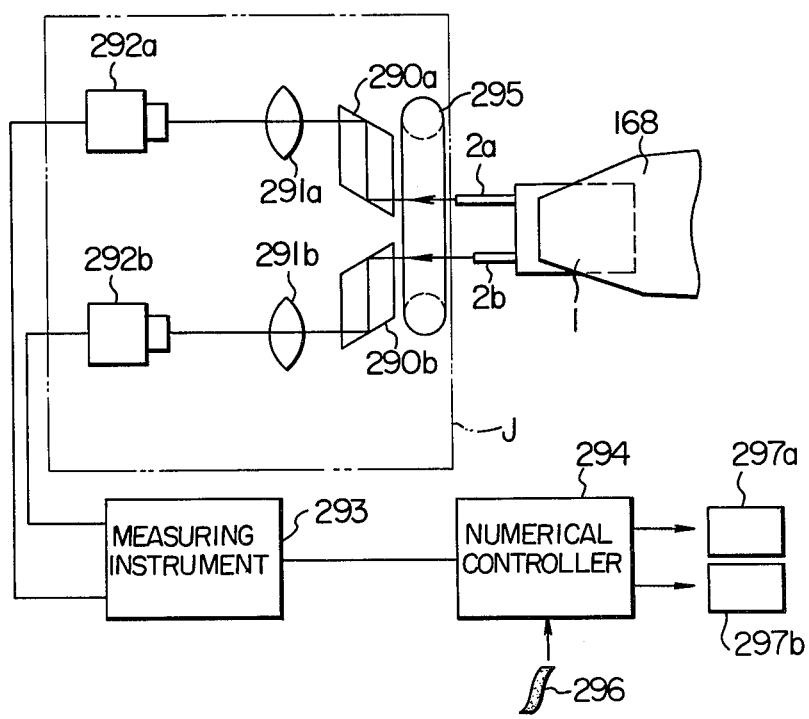
FIG. 16 shows a configuration of a measuring instrument.

The measuring instrument J comprises, as shown in FIG. 16, prisms 290a and 290b, lenses 291a, 291b, and TV cameras 292a, 292b respectively for the lead wires 2a and 2b of different lengths of the electronic element 1. 295 denotes a ring light illuminating the foward ends of the lead wires 2a, 2b. The light emitted from the ring light 295 radiates the forward ends of the lead wires 2a and 2b respectively. The light images reflected on the forward ends of the lead wires 2a and 2b are picked up by the TV cameras 292a and 292b respectively. The video signals obtained from the TV cameras 292a and 292b are converted into binary values at predetermined threshold level at the measuring instrument 293. At the same time, this signal is sampled by a clock signal into picture elements. This binary picture element signal is used to measure the center position (in X-Y coordinate) of the forward ends of the lead wires 2a and 2b by reference to the horizontal sync signal Hsync and the vertical sync signal Vsync.

The positioning device L is disposed slidably on a pair of rails fixed on the machine frame P and comprises a table 301 adapted to be driven for indexing in the direction X by a X-direction pulse motor 297a and a table 303 slidably supported on a couple of rails 302 fixed on the table 301 in the direction perpendicular to the sliding direction of the table 301 and adapted to be driven for indexing in the direction Y by a Y-direction pulse motor 297b. The printed circuit board 5 is adapted to be positioned appropriately on this table 303. The difference between the positions of the forward ends of the lead wires 2a and 2b determined by the measuring instrument 293 and reference positions of the lead wires 2a and 2b are determined respectively.

The positional data (X-Y coordinate) of the insertion holes 6 formed in advance at predetermined positions on the printed circuit board 5 are written into such a recording medium as paper tape 296 and stored in a numerical controller 294. The output of the measuring instrument 293 is corrected by reference to the coordinate of the insertion holes of the lead wires stored in the numerical controller 294. By use of this corrected signal, the numerical controller 294 drives through an X-direction pulse motor 297a and a Y-direction pulse motor 297b the X-direction table 301 and the Y-direction table 303, thereby setting the centers of the lead wires 2a and 2b to the positions of the insertion holes respectively.

In the case of the lead wire insertion holes formed in the printed circuit board at high accuracy, the positional coordinate of the insertion holes is given in the form of design values. In the case where the machining accuracy is low, however, it is necessary not only to measure the positions of the insertion holes by the measuring instrument for each printed circuit board but to determine the diviation from the design value and to drive the X-direction table 301 and the Y-direction table 303 by the amount of deviation for correction.

Figure 17A:
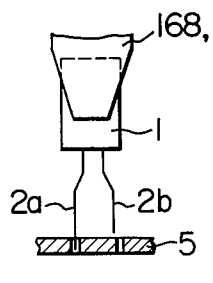
FIGS. 17a to 17c are diagrams showing lead wires being inserted into the insertion holes of a printed circuit board.
Figure 17B:
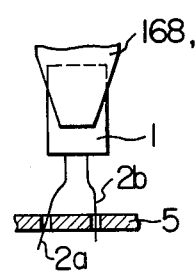
Figure 17:
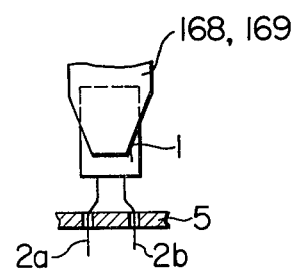

In the above-mentioned configuration, the electronic element 1 is cut into individual units with a tape chip 3a by the parts supply unit C, and with the tape chip 3a chucked by the transport pallets N, transported by the parts transport section B to the delivery position of the insertion head E of the delivery device F. Then the lead wires 2 of the electronic element 1 are held in the chuck of the delivery device F for transfer from the transport pallet N to the insertion head E positioned at station (a). The insertion head E holds the body of the electronic element 1 by the chucks 168 and 169. When the insertion head E is moved by the indexing section G and stops at station (b), the lead wires 2 are cut to different lengths by the cutting device H. Thus the tape chip 3a is separated at this step. This step is followed by the movement of the insertion head E by the indexing section G until it stops at the station (c) of the measuring instrument H. The measuring instrument J measures the position of the forward end of each of the lead wires 2. The indexing section G moves the insertion head E and stops it at the insertion station, followed by the inserting process by the driving section K. The printed circuit board 5 is fixed by the positioning device L. The positioning device L place in position the forward ends of the lead wires 2 and the insertion holes 6 on the basis of the data obtained by the measuring instrument H. First, as shown in FIG. 17a, the longer lead wire 2a is positioned and slightly inserted. Then as shown in FIG. 17b, the shorter lead wire 2b is positioned and inserted, followed by insertion of both the lead wires 2a and 2b into the corresponding insertion holes of the printed circuit board 5.

In other words, on the basis of the deviation of the position of each lead wire measured by the measuring instrument J from a reference position, the position of the printed circuit board 5 is appropriately corrected for insertion of the lead wires one by one.

Upon completion of insertion of the lead wires, the electronic element 1 is fixed on the printed circuit board 5 by a bending device (not shown). The above-mentioned processes are repeated thereby to insert the electronic element 1 into the printed circuit board 5.

As described above, according to the present invention, the insertion head is not required to be provided with a conventional mechanical guide (a lead guide or a lead chuck) for deforming the lead wire to attain a predetermined distance between the lead wires in inserting the lead wires into the printed circuit board 5, thus improving the density of insertion of the electronic elements into the printed circuit board. Further, according to the present invention, it is not necessary that the pitch between lead wires of the electronic elements be fixed, and it is possible to insert lead wires of various pitches of electronic elements into the printed circuit board by a single inserting machine or a single insertion head, thus improving the inserting ability remarkably. Furthermore, in view of the fact that the index table carries a plurality of insertion heads whose functions are limited to vertical movement and change in inserting direction, insertion of electronic elements at a speed at least five times higher than in conventional apparatuses is possible.

We claim:

1. An apparatus for inserting electronic elements, comprising:
   (a) means for supplying electronic elements;
   (b) means for cutting to different lengths a plurality of lead wires extended in the same direction from the body of an electronic element supplied from said electronic element supply means;
   (c) an insertion head including (A) a chuck mechanism for holding the body of an electronic element with the lead wires thereof cut to different lengths by said cutting means and (B) an insertion mechanism for moving said chuck mechanism vertically along the extension of said lead wires with respect to a printed circuit board;
   (d) means for measuring the position of the forward end of each of said lead wires along the X and Y axes of the surface of said printed circuit board, said lead wires being held by said chuck mechanism of said insertion head;
   (e) positioning means for moving said electronic element and said printed circuit board relatively to each other along the X and Y axes in accordance with the positions of the forward ends of the lead wires measured by said measuring means and the positions of the insertion holes of said printed circuit board, thereby setting the centers of the lead wires to the center positions of said insertion holes; and (f) control means which, after the center axis of the forward end of the longest lead wire among said lead wires of different lengths of each electronic element is set to the center position of an associated insertion hole, actuates said insertion mechanism so that only the longest lead wire is inserted into an associated insertion hole, the next longest lead wire being held without contacting the substrate, followed by the process of setting the center axis of the forward end of said next longest lead wire to the center position of an associated insertion hole, said next longest lead wire being then inserted into said insertion hole, thus sequentially inserting the forward ends of said plurality of lead wires into the associated insertion holes respectively.

2. An apparatus for inserting electronic elements according to claim 1, wherein said insertion head includes means for changing the direction of said plurality of lead wires with respect to the insertion holes of said printed circuit board by rotating said chuck mechanism by a predetermined angle around an axis perpendicular to the surface of said printed circuit board.

3. An apparatus for inserting electronic elements according to claim 1 or 2, wherein said positioning means includes an X table and a Y table carrying said printed circuit board.

4. An apparatus for inserting electronic elements according to claim 1 or 2, wherein said measuring means includes means for picking up an optical image of the forward end of each of said lead wires for measuring the position of the forward end of each of said lead wires optically.

5. An apparatus for inserting electronic elements according to claim 4, comprising a plurality of said pick-up means corresponding to said lead wires respectively thereby to form optical images of the forward ends of said lead wires of different lengths on said respective pick-up means.

6. An apparatus for inserting electronic elements according to claim 1 or 2, comprising a plurality of said insertion heads provided on stepwise transport means including an index table adapted for stepwise motion, said insertion heads being moved stepwise sequentially from a measuring station having said measuring instrument to an insertion station having said positioning means.

7. An apparatus for inserting electronic elements according to claim 1 or 2, wherein said electronic elements are taped to each other and are separated by said electronic element supply means into individual electronic elements having a tape chip on the lead wires thereof, at least four said insertion heads being arranged equidistantly along the outer periphery of said stepwise transport means including an index table, and the bodies of the electronic elements supplied in separate units from said electronic element supply means are transferred stepwise sequentially to a delivery station for delivering said bodies of said electronic elements to said chuck mechanism of said insertion heads, to a cutting station for cutting said lead wires to different lengths by said cutting means and removing said tape chips, to a measuring station including said measuring means, and to an insertion station including said positioning means.

8. An apparatus for inserting electronic elements, comprising:
   (a) means for cutting to different lengths a plurality of lead wires of an electronic element extended in the same direction;
   (b) an insertion head including (A) a chuck mechanism for holding the body of the electronic element with the lead wires thereof cut to different lengths by said cutting means and (B) an insertion mechanism for moving said chuck mechanism vertically with respect to a printed circuit board in the direction of extension of said lead wires;
   (c) means for measuring the position of the forward end of each of the lead wires of the electronic element held by said chuck mechanism of said insertion head, along the X and Y axes on the surface of said printed circuit board;
   (d) substrate positioning means for holding said printed circuit board having a plurality of holes for insertion of said lead wires of said electronic element, said substrate positioning means moving said substrate along the X and Y axes in the plane of said substrate; and
   (e) control means for driving said positioning means while at the same time actuating said insertion mechanism in accordance with the positions of the forward ends of said lead wires measured by said measuring means and the positions of said insertion holes for said lead wires, said control means driving said positioning means in a manner to set the center axis of the forward end of each of said lead wire of said electronic element to the center position of an insertion hole associated therewith in descendent order of the length of the lead wires, said control means thereafter driving said insertion mechanism in a manner to insert only the forward end of a lead wire into an insertion hole associated therewith while keeping the forward ends of the other shorter lead wires away from the substrate, said driving control process being repeated for each of said lead wires, thereby inserting said lead wires into the insertion holes of said substrate sequentially.

9. An apparatus for inserting electronic elements according to claim 8, wherein said measuring means includes means for picking up an optical image of the forward end of each of said lead wires for measuring the position of the forward end of each of said lead wires optically.

10. An apparatus for inserting electronic elements, comprising:
   (a) an insertion head including (A) a chuck mechanism for holding the body of an electronic element with lead wires thereof cut to different lengths and (B) an insertion mechanism for moving said chuck mechanism vertically along the extension of said lead wires with respect to a printed circuit board,
   (b) means for measuring the position of the forward end of each of said lead wires along the X and Y axes of the surface of said printed circuit board by optically recognizing said position by means of a picking-up means, said lead wires being held by said chuck mechanism of said insertion head;
   (c) positioning means for moving said electronic element and said printed circuit board relatively to each other along the X and Y axes in accordance with the positions of the forward ends of the lead wires measured by said measuring means and the positions of the insertion holes of said printed circuit board, thereby setting the centers of the lead wires to the center positions of said insertion holes; and
   (d) control means which, after the center axis of the forward end of the longest lead wire among said lead wires of different lengths of each electronic element is set to the center position of an associated insertion hole, actuates said insertion mechanism so that only the longest lead wire is inserted into an associated insertion hole, the next longest lead wire being held without contacting the substrate, followed by the process of setting the center axis of the forward end of said next longest lead wire to the center position of an associated insertion hole, said next longest lead wire being then inserted into said insertion hole, thus sequentially inserting the forward ends of said plurality of lead wires into the associated insertion holes respectively.

* * * * *